United States Patent
Ikitake et al.

(10) Patent No.: US 8,237,318 B2
(45) Date of Patent: Aug. 7, 2012

(54) MOTOR POSITIONING STRUCTURE

(75) Inventors: Yoshitaka Ikitake, Tokyo (JP); Toshiyuki Umemoto, Tokyo (JP); Kenta Hatano, Tokyo (JP); Toshihiko Miyake, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 126 days.

(21) Appl. No.: 12/922,018

(22) PCT Filed: Mar. 13, 2009

(86) PCT No.: PCT/JP2009/001135
§ 371 (c)(1),
(2), (4) Date: Sep. 10, 2010

(87) PCT Pub. No.: WO2009/150772
PCT Pub. Date: Dec. 17, 2009

(65) Prior Publication Data
US 2011/0012457 A1    Jan. 20, 2011

(30) Foreign Application Priority Data
Jun. 13, 2008   (JP) .................... 2008-155549

(51) Int. Cl.
*H02K 5/22* (2006.01)
(52) U.S. Cl. ...... 310/68 B; 310/71; 310/89; 310/156.05; 310/88; 310/156.06

(58) Field of Classification Search ............... 310/68 B, 310/71, 89, 156.05, 156.06, 68 R, 88, 68 D
See application file for complete search history.

(56) References Cited

U.S. PATENT DOCUMENTS

| | | | |
|---|---|---|---|
| 6,081,056 A | 6/2000 | Takagi et al. | |
| 6,497,035 B1 * | 12/2002 | Ratliff | 29/596 |
| 6,753,629 B2 * | 6/2004 | Doi et al. | 310/68 D |
| 6,873,076 B2 * | 3/2005 | Kaeufl et al. | 310/91 |

FOREIGN PATENT DOCUMENTS

| | | |
|---|---|---|
| JP | 2000-287408 A | 10/2000 |
| JP | 2004-48904 A | 2/2004 |
| WO | WO 97/33359 A1 | 9/1997 |

OTHER PUBLICATIONS

Machine Translation of JP 2004-48904 A.*
Machine Translation of JP 2000-287408 A.*

* cited by examiner

*Primary Examiner* — Quyen Leung
*Assistant Examiner* — Daniel Haile
(74) *Attorney, Agent, or Firm* — Birch, Stewart, Kolasch & Birch, LLP

(57) ABSTRACT

A motor positioning structure is constructed by providing a plurality of positioning pins 28, 29 for positioning a circuit board 22 on a case 21 of a circuit main body 3 and also providing receiving holes 35, 36 for receiving the positioning pins 28, 29 in a frame 4 on the side of a stator in a motor main body 2.

2 Claims, 4 Drawing Sheets

MOTOR POSITIONING STRUCTURE

TECHNICAL FIELD

The present invention relates to a positioning structure in a motor composed of a motor main body including a stator and other components, and a circuit main body including a circuit board.

BACKGROUND ART

An automobile is provided with a turbo unit in order to make effective use of the exhaust energy thereof. The turbo unit is arranged to operate a turbocharger by means of the exhaust thereof, and the flow rate of the exhaust is controlled by a valve. Opening of the valve is controlled by a motor (actuator). As environmental measures in recent years, there has been demanded more strictly controlling the amount of exhaust fed to the turbocharger. Therefore, a motor for driving the valve is required to be controlled with a greater accuracy.

Such a vehicle motor is provided with a detecting unit for detecting the position of a shaft of the motor. As a detecting unit, e.g., a structure is disclosed in which, as shown in FIG. 5, a sensor magnet 103 is disposed on the side of a shaft 102 supported on the side of a motor main body of a motor 101 and a detecting Hall element 106 for detecting the sensor magnet 103 is disposed on a circuit board 105 supported on a case 104 located on the side of a circuit main body of the motor 101. To be more specific, a magnet support member 108 is fixed on the shaft 102 supported rotatably relative to a stator 107 of the motor 101, and the sensor magnet 103 is attached on the face of the magnet support member 108. It is noted that the rotation of the shaft 102 is converted into the rectilinear motion thereof, which contributes to an opening or closing movement of the valve.

On the other hand, the case 104 is internally provided with a plurality of pins 109, and the pins 109 support the circuit board 105 with extending therethrough. The case 104 is integrally coupled to the end of the stator 107 with hot wires. The Hall element 106 for detection on the circuit board 105 detects the sensor magnet 103 on the side of the shaft 102 to be rotated, thus detecting the amount of rotation of the shaft 102 to measure the amount of opening and closing of the valve.

In a currently known structure of a motor, the motor main body and the circuit main body are fabricated separately from each other as described above, and as not depicted, it is arranged that a terminal connected to a coil of the motor 106 is molded on the side of the stator 107 of the motor main body and a connector connected to an external system is molded to the case 104 on the side of the circuit main body. This is because a convenience of fabrication, assembly, and so on of the motor in the manufacture thereof is considered. Further, as discussed above, the case 104 of the circuit main body is connected integrally to the stator 107 side of the motor main body through the use of hot wires. In this context, as a motor structure similar to the above-discussed one, a structure where a board is disposed on a stator side is disclosed in Patent Document 1.

Patent Document 1: International Publication WO97/33359

FIG. 6 schematically illustrates a coupling relation between members of a motor of which the structure is shown in FIG. 5. As shown in FIG. 6, the accuracy with which the circuit board 105 is positioned is determined by the accuracy with which the case 104 and the stator 107 are coupled to each other. Therefore, even if the Hall element 106 for detection is accurately positioned in the circuit board 105 to be mounted thereon, the displacement of the Hall element can occur after the case 104 is coupled to the stator 107 side with hot wires.

Further, in a structure where a circuit board is disposed on side of the stator as disclosed in Patent Document 1, it is difficult to electrically connect the circuit board to an external terminal, and though the accuracy on control can be kept at the same level, the structure is inferior in durability as compared with a structure where an external terminal is insert-molded on the side of the connector; consequently, the number of components is increased, and working processes and quality assurance involved thereby are difficult.

The present invention is made to solve the above-described problems, and an object of the present invention is to provide a motor positioning structure such that with respect to a sensor magnet that is one constituent element of a detecting unit on the side of the motor main body in the motor, the other constituent element disposed on the side of the circuit main body thereof can be positioned accurately.

DISCLOSURE OF THE INVENTION

A motor positioning structure according to the present invention has a structure of a motor which is constructed by combining a motor main body with a circuit main body, and which has provided on the side of the motor main body one constituent element of a position detecting unit, and has provided on the side of the circuit main body the other constituent element of the position detecting unit, wherein a plurality of positioning pins for positioning the circuit board are provided in the case in the circuit main body, while receiving holes for receiving the positioning pins are provided on the side of the stator in the motor main body.

According to the motor positioning structure of the present invention, the positioning pins for positioning the circuit board in the circuit main body are fitted into the receiving holes on the side of the stator of the motor main body, and thus both of the positioning of the circuit board in the circuit main body and the positioning of the circuit main body with respect to the motor main body are performed by means of the positioning pins. In such a way, the misalignment upon coupling of the circuit main body and the motor main body is prevented, and the constituent element on the side of the circuit main body of the detecting unit can be accurately positioned with respect to the constituent element on the side of the motor main body, to thus enhance the detection accuracy.

BEST MODE FOR CARRYING OUT THE INVENTION

Embodiments of the present invention will now be described with reference to the accompanying drawings in order to explain the present invention in more detail.

First Embodiment

Figure 1:
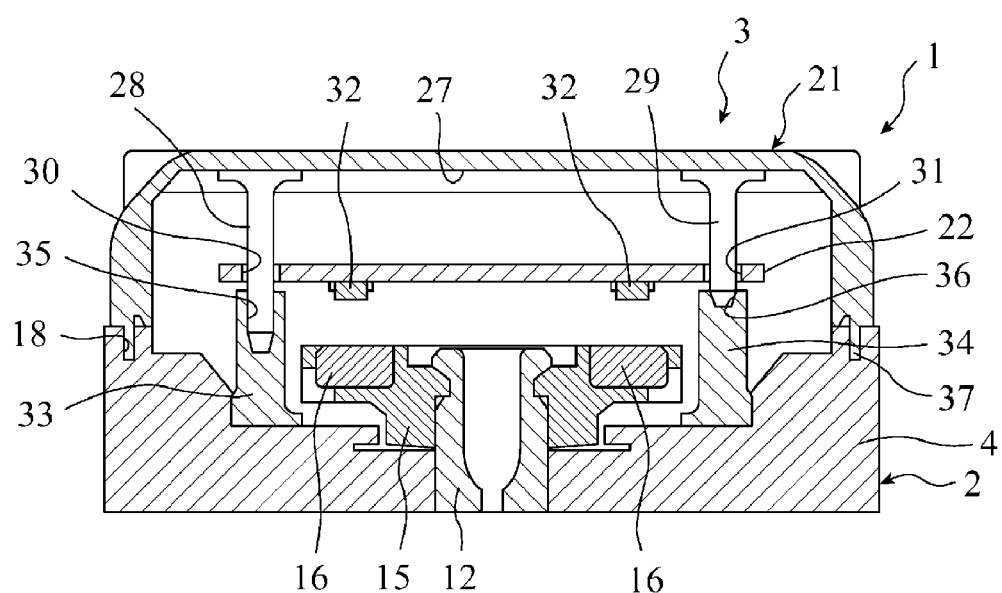
FIG. 1 is a sectional view of the fundamental portion of a motor positioning structure in accordance with the first embodiment of the present invention.
Figure 2:
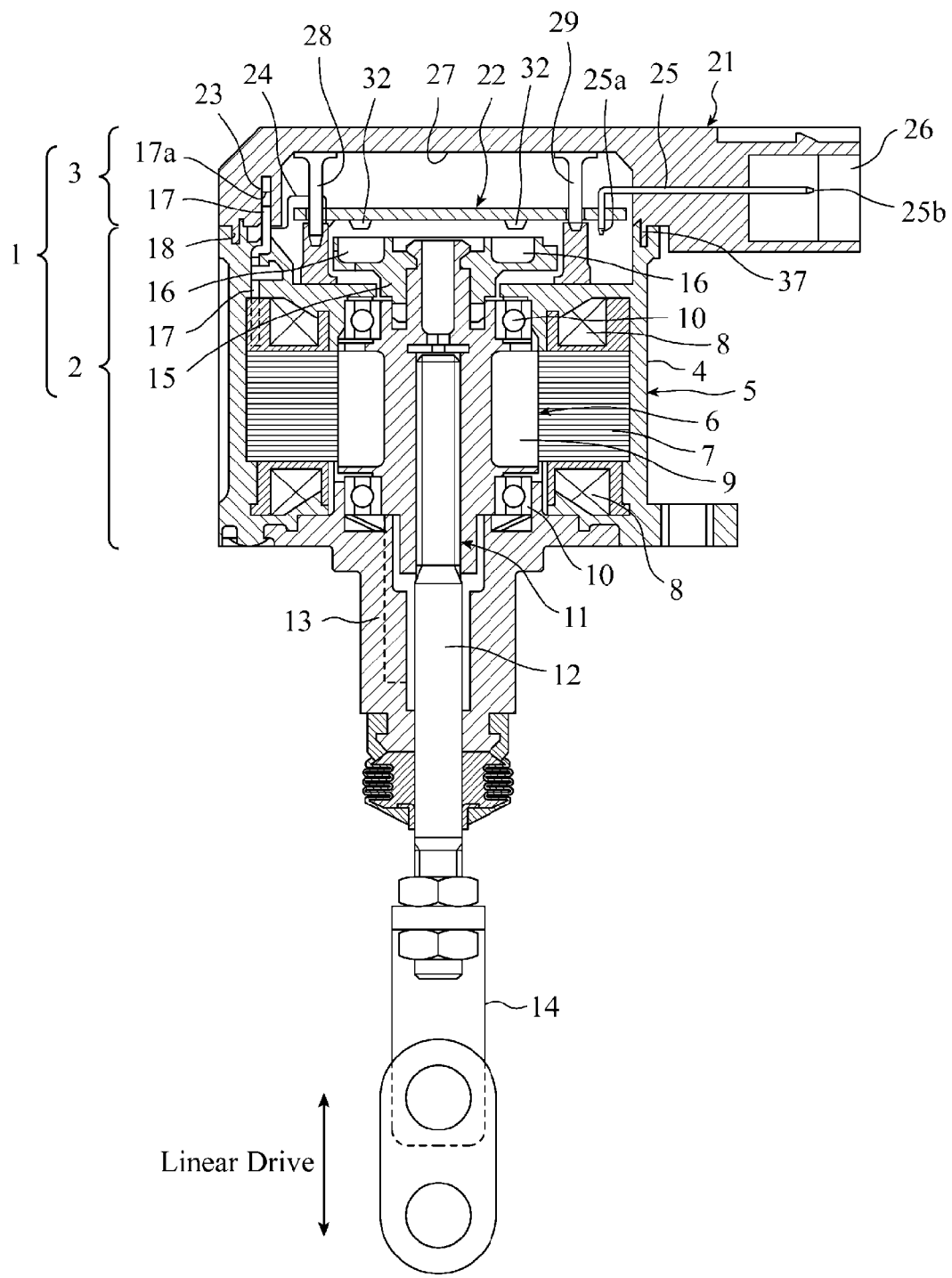
FIG. 2 is a sectional view of the whole motor including the motor positioning structure in accordance with the first embodiment of the present invention.
Figure 3:
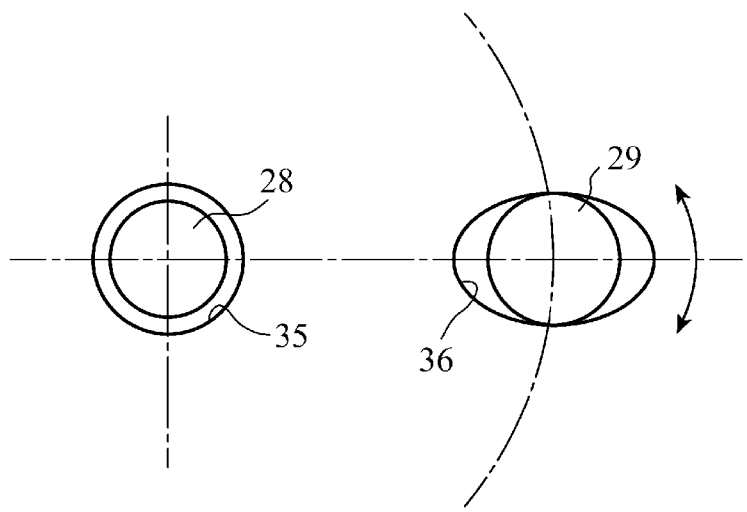
FIG. 3 is a schematic illustration of the positions and the shapes of pins and receiving holes in the motor positioning structure in accordance with the first embodiment of the present invention.
Figure 4:
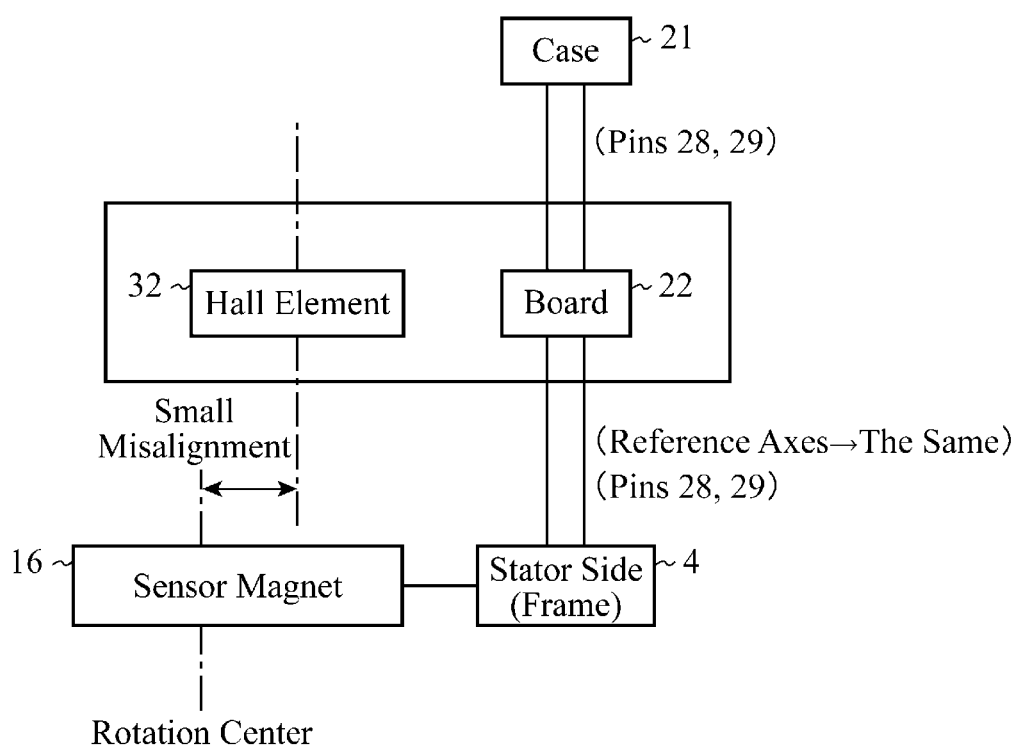
FIG. 4 is a schematic diagram showing a coupling relation between the fundamental members in the first embodiment of the present invention.
Figure 5:
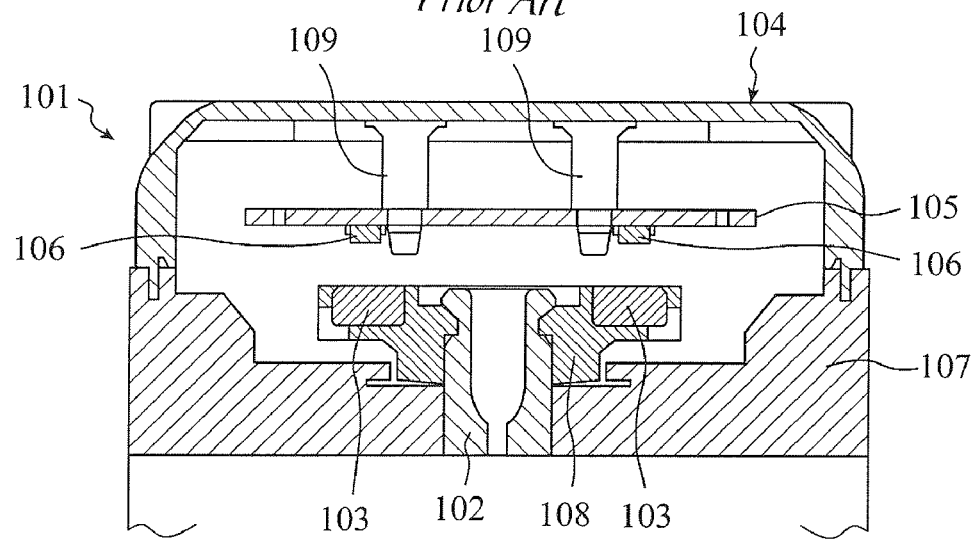
FIG. 5 is a sectional view showing a state where a sensor magnet, a Hall element for detection, and other components are attached in a conventional motor.
Figure 6:
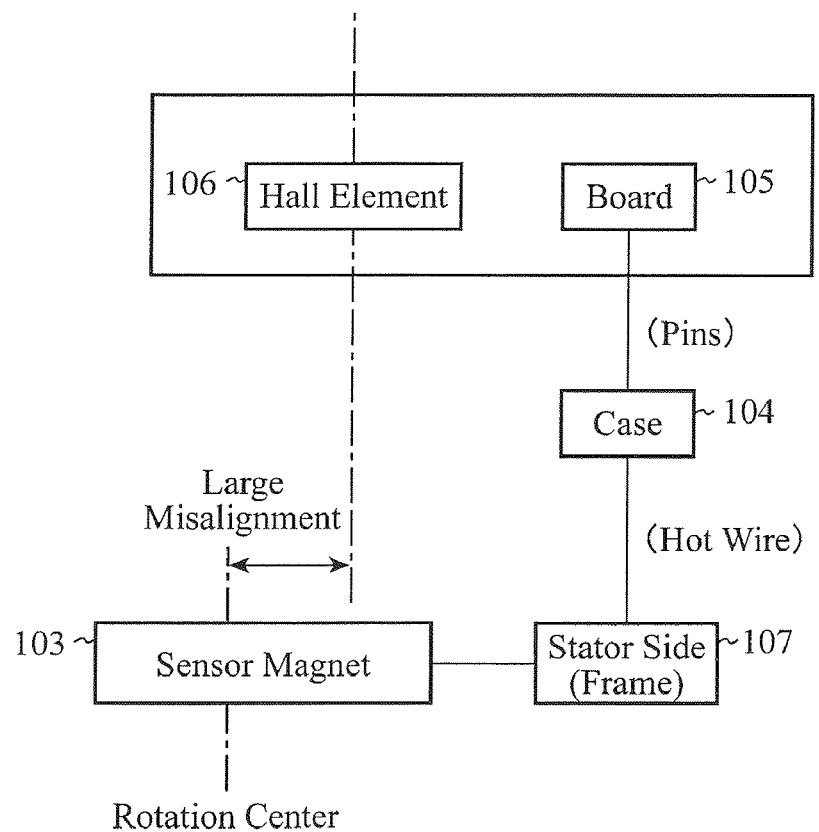
FIG. 6 is a schematic diagram showing a coupling relation between members in the structure shown in FIG. 5.

FIG. 1 is a sectional view of part of a motor positioning structure in accordance with the first embodiment, and FIG. 2 is a sectional view of the whole of a motor to which the motor positioning structure in accordance with the first embodiment is applied. Although both of FIG. 2 and FIG. 1 are longitudinal sectional views, they are different in sectional position from each other. FIG. 3 is a schematic illustration showing the shapes of positioning pins and receiving holes and the positional relation therebetween. FIG. 4 is a schematic diagram showing a coupling relation between the fundamental members in the first embodiment.

First, the structure of the whole motor (actuator) will be discussed with reference to FIG. 2. A motor 1 is composed of a motor main body 2 and a circuit main body 3. The motor main body 2 is formed by assembling a stator 5 and a rotor 6 into a tubular frame 4. The stator 5 is provided stationarily on the inner face of the frame 4, and is composed of a core 7 and a coil 8. In the internal center portion of the frame 4, the rotor 6 having a magnet 9 around the surrounding face thereof so as to face the stator 5 is rotatably supported through a bearing 10. A shaft 12 through a screw mechanism 11 is supported inside the rotor 6. The shaft 12 extends through a boss 13 provided at the end of the frame 4, and a joint 14 is provided at the tip thereof. The shaft 12 is connected to a drive shaft of a valve through the joint 14.

In the state shown in FIG. 2, a magnet support member 15 is attached integral to the upper portion of the rotor 6, and a plurality of sensor magnets 16 serving as one constituent element of a detecting unit are provided on the surface of the magnet support member. Moreover, in the frame 4 on the side of the stator 5, a coil line (motor terminal line) 17 for supplying electric current to the coil 8 of the stator 5 is buried by molding, and an end (terminal) 17a of the coil line projects from the end of the frame 4 to be taken out. A groove 18 for hot-wire coupling a case 21 on the side of the circuit main body 3 (described later) to the side of the motor main body is formed along the upper fringe of the tubular frame 4.

The circuit main body 3 is constructed by having a circuit board 22 held inside the case 21 in the shape of a container. A connector 23 for the coil line for receiving a terminal 17a of the coil line 17 to be inserted is formed in the case 21. The connector 23 for the coil line and the circuit board 22 are connected to each other by way of a connecting wire 24. A terminal line 25 for transmission and reception of signals for supplying an electrical current to the circuit board 22 is buried in the case 21 by molding. One end 25a of the terminal line 25 is connected to the circuit board 22, and the other end (terminal) 25b of the terminal line 25 projects into an external-connection connector 26 formed on the case 21. A cable from an external system is connected to the external-connection connector 26 to feed an electric current to the circuit board 22 and perform the transmission and reception of signals.

As shown in FIG. 1, a long pin 28 and a short pin 29 that is shorter than the long pin 28, both working as positioning pins, are provided at a predetermined spacing on a ceiling inner surface 27 of the case 21. Positioning and fixing holes 30, 31 are bored through the circuit board 22 corresponding to the long pin 28 and the short pin 29. Hall elements 32 for detection that are the other constituent elements of the detecting unit are provided on the back of the circuit board 22 corresponding to the positions of the sensor magnets 16 on the side of the shaft 12.

A columnar long-pin receiving section 33 and a short-pin receiving section 34 is provided in a rising manner in the frame 4 of the motor main body 2 that is located on the side of the stator 5. A long-pin receiving hole 35 is provided at the long-pin receiving section 33. The long pin 28 is inserted into the long-pin receiving hole 35, when the case 21 is fixed to the frame 4. As shown in FIG. 3, the long-pin receiving hole 35 is arranged to have an internal diameter slightly larger than the diameter of the long pin 28. A short-pin receiving hole 36 is provided at the short-pin receiving section 34. The short pin 29 is inserted into the short-pin receiving hole 36, when the case 21 is fixed to the frame 4. As shown in FIG. 3, the short-pin receiving hole 36 is arranged to have an elliptical shape, which is longer in the direction of the line passing the center of the short-pin receiving hole 36 and the center of the long-pin receiving hole 35, and which has a diameter substantially equal to the diameter of the short pin 29 in a direction orthogonal to the above direction (i.e., a rotational direction about the long pin 28 inserted in the long-pin receiving section 33, as indicated by arrows in FIG. 3).

A convexity 37 to be fitted into the groove 18 is formed along the fringe of the case 21, the groove being provided along the frame 4 of the motor main body 2 located on the side of the stator 5.

The motor main body 2 and the circuit main body 3 are assembled separately from each other. In the circuit main body 3, the positioning and fixing holes 30, 31 of the circuit boards 22 are fitted over the long pin 28 and the short pin 29 of the case 21, respectively; thus, the circuit board 22 is positioned and also supported by those pins 28, 29. The connecting wire 24 and the terminal line 25 are connected to the circuit board 22.

Under such a condition, the convexity 37 of the case 21 is inserted into the groove 18 of the frame 4 in the motor main body 2, and the case is coupled to the frame with hot wires. At that time, the long pin 28 is first inserted into the long-pin receiving hole 35 of the long-pin receiving section 33 of the frame 4 on the side of the stator 5, and then the short pin 29 is inserted into the short-pin receiving hole 36 of the short-pin receiving section 34. The insertion of the short pin 29 into the short-pin receiving hole 36 is carried out while probing or locating the proper position by rotating the case 21 about the long pin 28 inserted into the long-pin receiving hole 35. The two pins 28, 29 are inserted into the receiving holes 35, 36, respectively, which leads to position directly the case 21 and the circuit board 22 on the side of the stator 5. It should be noted that the short-pin receiving hole 36 is provided in an ellipsoidal shape, and thus small variations in size can be absorbed.

The coupling between the case 21 and the frame 4 is performed when the coupling between the convexity 37 on the side of the case 21 and the groove 18 of the frame 4 is carried out through the use of hot wires. In this context, when the case 21 is coupled to the frame 4, the terminal 17a of the coil line 17 on the side of the motor main body 2 is inserted into a coil-line connector 23 of the case 21, thus enabling the coil 8 to be connected to the side of a power source.

As shown in FIG. 4, the circuit board 22 is positioned by the pins 28, 29, and the case 21, that is, the circuit board 22 is positioned on the side of the motor main body 2 by the same pins 28, 29. The Hall elements 32 for detection are positioned and disposed on the circuit board 22; thus, when the circuit board 22 is accurately positioned on the side of the motor main body 2, the Hall elements 32 for detection are positioned with a great accuracy with respect to the sensor magnets 16 on the side of the stator 5. More specifically, misalignment or displacement of the sensor magnet 16 with respect to the rotation center (the rotation center of the shaft 12) is extremely reduced.

In such a motor 1, a cable is connected to the external-connection connector 26 of the case 21. An electric current is supplied to the circuit board 22 through the terminal line 25, and also transmission and reception of signals are carried out. An electric current is fed to the coil 8 of the motor main body 2 through the circuit board 22, the connecting wire 24, and the coil line 17. The rotor 6 is rotated relative to the stator 5 when the coil 8 is supplied with an electric current, and the shaft 12 is linearly driven by the rotation of the rotor 6 through the screw mechanism 11 to open and close the valve. The amount of opening and closing of the valve driven by the linear drive of the shaft 12 is controlled by detecting the amount of rotation of the shaft 12. The amount of rotation of the shaft 12 is measured by detection of the sensor magnets 16 by the Hall elements 32 for detection. The Hall elements 32 for detection are positioned with a great accuracy with respect to the sensor magnets 16, and thus the accuracy with the detection of the amount of rotation is enhanced. As a result, the accuracy upon controlling the amount of opening of the valve is improved.

According to the motor positioning structure of the first embodiment, the long pin 28 and the short pin 29 for positioning the circuit board 22 in the circuit main body 3 are fitted into the receiving holes 35, 36 located on the side of the stator 5 of the motor main body 2, thus positioning the circuit board 22 in the circuit main body 3 and simultaneously positioning the circuit main body 3 with respect to the motor main body 2. To be more specific, the reference axes for both the positionings are the same. Thus, the displacement of the circuit board when the circuit main body 3 and the motor main body 2 are coupled to each other is prevented, and the Hall elements 32 for detection can be positioned with a great accuracy with respect to the sensor magnets 16 located on the side of the motor main body 2 to enhance the detection accuracy. Therefore, when the motor positioning structure is applied to the opening and closing drive of a valve for adjusting the amount of exhaust fed to a turbocharger of an automobile, the control of the amount of exhaust becomes more accurate, and the more proper utilization of the exhaust energy can be promoted.

In the motor positioning structure in accordance with the first embodiment, one of the two positioning pins is provided with a long pin 28 having a longer length, while the other is provided with a short pin 29 having a shorter length, the long-pin receiving hole 35 for receiving the long pin 28 is arranged such that a clearance between the hole and the long pin 28 is small, and further the short-pin receiving hole 36 for receiving the short pin 29 is formed in an ellipsoidal shape such that the rotation of the short pin about the long pin 28 is restricted. Thus, upon coupling of the case 21 to the side of the motor main body 2, it is possible for the long pin 28 to first enter the long-pin receiving hole 35, and then fit the short pin 29 into the short-pin receiving hole 36 by rotating the case 21 about the long pin 28. Consequently, assembly of the case 21 thereto is facilitated. Furthermore, the short-pin receiving hole 36 is provided in an elliptical shape, and thus it is possible to prevent the ability of the components to be assembled from being reduced by variations in the dimension of components, and minimize the misalignment between the rotation center of the sensor magnet 16 and that of the Hall element 32 for detection.

It should be understood that the above-discussed first embodiment is one example in the embodiment of the present invention. For example, the coupling unit between the case 21 of the circuit main body 3 and the frame 4 of the motor main body 2 is not limited to the one with the hot wires, other coupling unit can be employed instead, and the number of pins for positioning can be provided with three or more, and is not limited to two. Moreover, a motor including the motor positioning structure is applicable to a variety of purposes, and is not limited to a vehicle motor.

INDUSTRIAL APPLICABILITY

As discussed above, the motor positioning structure according to the present invention is arranged, in a structure of a motor, which is constructed by combining a motor main body and a circuit main body in order to accurately position one constituent element constituting a detecting unit disposed on the side of the circuit main body with respect to a sensor magnet that is the other constituent element constituting a detecting unit disposed on the side of the motor main body in a motor, and in which one constituent element of the position detecting unit is disposed on the side of the motor main body and the other constituent element of the position detecting unit is disposed on the side of the circuit main body; and the motor positioning structure is arranged such that a case located in the circuit main body is provided with a plurality of positioning pins for positioning a circuit board, and also the side of a stator located in the motor main body is provided with receiving holes for receiving the positioning pins. Thus, the motor positioning structure is suitable for use, e.g., in a positioning structure of a motor for controlling the opening of an exhaust-flow-rate controlling valve of a turbocharger of an automobile.

The invention claimed is:

1. A motor positioning structure having a structure of a motor,
    which is constructed by combining a motor main body having a motor terminal for connecting a coil of a stator to an external system with a circuit main body including a case that houses a circuit board having mounted thereon a circuit for supplying an electrical signal to the motor main body, and that has a terminal for connection to a connector, and
    which has provided on the side of the stator a constituent element of a detecting unit, and has provided on the circuit board a position detecting element serving as another constituent element of the detecting unit,
    wherein a plurality of positioning pins for positioning the circuit board are provided in the case in the circuit main body, while receiving holes for receiving the positioning pins are provided on the side of the stator in the motor main body.

2. The motor positioning structure according to claim 1, wherein the positioning pins include a long pin and a short pin which is shorter than the long pin,
    the receiving hole for receiving the long pin is formed such that a clearance between the hole and the long pin is small, and
    the receiving hole for receiving the short pin is elliptically formed so as to restrict the rotation of the short pin about the long pin.

* * * * *